United States Patent
Larsson et al.

(10) Patent No.: US 11,854,296 B2
(45) Date of Patent: Dec. 26, 2023

(54) TFT-BASED FINGERPRINT SENSING SYSTEM WITH CALIBRATION CIRCUITRY

(71) Applicant: Fingerprint Cards Anacatum IP AB, Gothenburg (SE)

(72) Inventors: Andreas Larsson, Herrljunga (SE); David Carling, Mölndal (SE)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 0 days.

(21) Appl. No.: 17/913,226

(22) PCT Filed: Mar. 23, 2021

(86) PCT No.: PCT/SE2021/050249
§ 371 (c)(1),
(2) Date: Sep. 21, 2022

(87) PCT Pub. No.: WO2021/201745
PCT Pub. Date: Oct. 7, 2021

(65) Prior Publication Data
US 2023/0169787 A1  Jun. 1, 2023

(30) Foreign Application Priority Data
Apr. 1, 2020 (SE) .................................. 2050370-2

(51) Int. Cl.
*G06V 40/13* (2022.01)
*G06V 40/12* (2022.01)
*H01L 25/16* (2023.01)

(52) U.S. Cl.
CPC ...... *G06V 40/1318* (2022.01); *G06V 40/1365* (2022.01); *H01L 25/167* (2013.01)

(58) Field of Classification Search
CPC .................................................... G06V 40/13
See application file for complete search history.

(56) References Cited

U.S. PATENT DOCUMENTS

2002/0017136 A1* 2/2002 Morimura .......... G06V 40/1306
                                                 73/514.32
2003/0082463 A1   5/2003 Laidig et al.
(Continued)

FOREIGN PATENT DOCUMENTS

KR    10-1772491          8/2017
WO    WO 2008/131313     10/2008
WO       2017003848 A1    1/2017

OTHER PUBLICATIONS

PCT International Search Report and Written Opinion dated Apr. 29, 2021 for International Application No. PCT/SE2021/050249, 12 pages.

(Continued)

*Primary Examiner* — Joseph R Haley
(74) *Attorney, Agent, or Firm* — Westman, Champlin & Koehler, P.A.

(57) ABSTRACT

A fingerprint sensing system comprising a plurality of conductive selection lines; a plurality of conductive read-out lines crossing the selection lines; selection circuitry controllable to provide a selection signal on at least one selected selection line in the plurality of selection lines; a plurality of pixel elements formed at intersections between the selection lines and the read-out lines; read-circuitry coupled to each read-out line in the plurality of read-out lines, the read-out circuitry being configured to acquire a read-out signal via a read-out line connected to a selected pixel element, and calibration circuitry having an input for receiving a calibration input signal and an output for providing a calibration output signal, the calibration output signal being formed through interaction between the calibration input signal and the calibration circuitry.

11 Claims, 9 Drawing Sheets

(56) References Cited

U.S. PATENT DOCUMENTS

| | | |
|---|---|---|
| 2011/0175703 A1 | 7/2011 | Benkley, III |
| 2014/0333328 A1 | 11/2014 | Nelson et al. |
| 2017/0255806 A1 | 9/2017 | Kang et al. |
| 2019/0318147 A1 | 10/2019 | Shen et al. |
| 2021/0055823 A1* | 2/2021 | Guo ................... G06F 3/04166 |

OTHER PUBLICATIONS

Extended European Search Report from European Patent Application No. 21780059.8, dated Aug. 9, 2023.

* cited by examiner

TFT-BASED FINGERPRINT SENSING SYSTEM WITH CALIBRATION CIRCUITRY

CROSS-REFERENCE TO RELATED APPLICATIONS

This application is a 371 U.S. National Stage of International Application No. PCT/SE2021/050249, filed Mar. 23, 2021, which claims priority to Swedish Patent Application No. 2050370-2, filed Apr. 1, 2020. The disclosures of each of the above applications are incorporated herein by reference in their entirety.

FIELD OF THE INVENTION

The present invention relates to a fingerprint sensing system for sensing a finger surface of a finger, comprising a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; and a plurality of pixel elements, each being formed at a respective intersection between a selection line in the plurality of selection lines and a read-out line in the plurality of read-out lines.

BACKGROUND OF THE INVENTION

Fingerprint sensing systems are widely used as means for increasing the convenience and security of electronic devices, such as mobile phones etc. In various electronic devices having a display, it may be desirable to provide for fingerprint sensing within the area occupied by the display. It may also be desirable to provide for fingerprint sensing across a relatively large area of the display.

A suitable configuration for a fingerprint sensing system for this application may be a fingerprint sensing system having a configuration with a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; and a plurality of pixel elements, each being formed at a respective intersection between a selection line in the plurality of selection lines and a read-out line in the plurality of read-out lines.

This sensor configuration can be at least partly realized using relatively cost-efficient materials and technologies, such as TFT (thin film transistor) technology on a glass or plastic substrate.

Due to the relatively weak signals often involved in fingerprint sensing, it would be desirable to provide for improved quality of the signals provided by the fingerprint sensing system.

SUMMARY

It is an object of the present invention to provide an improved fingerprint sensing system, in particular a fingerprint sensing system providing for improved signal quality.

According to the present invention, it is therefore provided a fingerprint sensing system for sensing a finger surface of a finger, comprising a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; a plurality of pixel elements, each being formed at a respective intersection between a selection line in the plurality of selection lines and a read-out line in the plurality of read-out lines, each pixel element in the plurality of pixel elements comprising: a sensing element responsive to a property indicative of a distance between the sensing element and the finger surface to provide an output indicating a sensed value of the property; and a sensing signal providing element coupled to the sensing element, the selection line and the read-out line, the sensing signal providing element being configured to provide to the read-out line, in response to the selection signal being provided on the selection line, a sensing signal being dependent on the output provided by the sensing element; read-out circuitry coupled to each read-out line in the plurality of read-out lines for acquiring the sensing signal via a read-out line connected to a selected pixel element; and calibration circuitry having an input for receiving a calibration input signal and an output for providing a calibration output signal, the calibration output signal being formed through interaction between the calibration input signal and the calibration circuitry, wherein: each pixel element in the plurality of pixel elements comprises semiconductor circuitry, and the calibration circuitry comprises semiconductor circuitry; and the semiconductor circuitry comprised in each pixel element and the semiconductor circuitry comprised in the calibration circuitry have been formed using the same materials and the same processing steps.

The sensing element may be responsive to a physical property that differs in dependence on the topography of the finger surface. Examples of such physical properties include capacitive coupling, mechanical coupling, thermal coupling, and optical reflection. As is well known to those of ordinary skill in the art, various sensing element configurations exist, that are suitable for sensing one or more of these physical properties indicative of the interaction between the finger and the sensing element. In the case of capacitive coupling, the sensing element may, for example, include a conductive plate where charge can be accumulated; in the case of mechanical coupling, the sensing element may, for example, have piezo-electric properties; in the case of thermal coupling, the sensing element may, for example, include a resistor or other circuit element that can be controlled to generate heat or which is response to a flow of heat; and in the case of optical reflection, the sensing element may, for example, include a photo-diode that generates a photocurrent indicative of an amount of incident light.

The sensing signal providing element may be any element that can be selected, and, in response to being selected, can provide a sensing signal that depends on the output provided by the above-mentioned sensing element. As will be understood by one of ordinary skill in the art, the sensing signal providing element may have various configurations, including but not limited to switching circuitry controllable to connect an output of the sensing element to the readout line, and/or signal conversion circuitry controllable to convert the output of the sensing element to a sensing signal and to provide the sensing signal to the read-out line. The sensing signal providing circuitry may comprise at least one transistor, and the sensing signal may be provided to the read-out line as a voltage or a current.

The present invention is based on the realization that large area fingerprint sensing systems, in particular if they are implemented using technology selected for cost-efficiency, may exhibit relatively large variations in output signals that are not related to the topography of the finger surface that is to be sensed. Such variations may, for example, be due to differences in the process used for manufacturing semiconductor circuitry comprised in the pixel elements and/or other parts of the fingerprint sensing system and/or temperature dependent properties of circuitry comprised in the fingerprint sensing system. The present inventors have further realized that at least some of such variations can conveniently be addressed by providing the fingerprint sensing system with calibration circuitry formed using the same materials and processing steps used for forming the pixel elements. A known calibration input signal may then be provided to the calibration circuitry, and a calibration output signal that is formed through interaction between the calibration input signal and the calibration circuitry may then provide useful information about the properties of the calibration circuitry, and thus also about the pixel elements and possibly also other parts of the fingerprint sensing system.

Accordingly, embodiments of the present invention enable tuning of the fingerprint sensing system and/or changes in control parameters for the fingerprint sensing system depending on properties of the fingerprint sensing system. This, in turn, provides for improvement of the quality of signals provided by the fingerprint sensing system, allowing for improved fingerprint sensing performance.

For instance, sensing and/or read-out settings of the fingerprint sensing system may be modified based on a relation between the calibration output signal and the calibration input signal. This may, for example, make it possible to avoid or at least reduce the occurrence of saturation in the read-out circuitry. As a consequence, the signal-to-noise ratio of the fingerprint sensing system can be increased and/or the useable temperature range of the fingerprint sensing system can be expanded.

According to embodiments of the present invention, the fingerprint sensing system may comprise, in addition to the plurality of selection lines and the plurality of read-out lines, a calibration input line connected to the input of the calibration circuitry; and a calibration output line connected to the output of the calibration circuitry.

In embodiments, the fingerprint sensing system may further comprise calibration signal providing circuitry coupled to the calibration circuitry for providing the calibration input signal to the calibration circuitry and receiving the calibration output signal provided by the calibration circuitry.

Moreover, the fingerprint sensing system may comprise operation control circuitry coupled to the calibration signal providing circuitry for controlling operation of the fingerprint sensing system based on a relation between the calibration output signal and the calibration input signal.

The fingerprint sensing system according to embodiments of the present invention may advantageously be implemented using TFT-technology, providing for a cost-efficient fingerprint sensing system exhibiting a large sensing area.

For improved performance, some functionality of the fingerprint sensing system according to embodiments of the present invention may be provided using CMOS technology, advantageously in the form of an ASIC coupled to a TFT-module including at least the selection lines, the read-out lines, the pixel elements, and the calibration circuitry. In particular, the above-mentioned calibration signal providing circuitry may be comprised in a CMOS-component, such as an ASIC, which may provide the advantage of more compact circuitry with more well-controlled and less temperature-sensitive properties.

According to various embodiments, furthermore, the calibration circuitry may comprise a sensing element responsive to a property indicative of a distance between the sensing element and the finger surface to provide an output indicating a sensed value of the property.

Hereby, it may be ensured that any conclusions drawn and/or actions taken based on the calibration output signal, or a relation between the calibration output signal and the calibration input signal will be relevant for the present properties of the sensing elements of the fingerprint sensing system. This may, in turn, provide for further improved configuration and/or control of the fingerprint sensing system.

In such embodiments, the input for receiving the calibration input signal may be constituted by the sensing element of the calibration circuitry. The calibration input signal may then be provided by the above-mentioned property, such as light, electric charge, mechanical deflection/deformation, heat etc.

According to embodiments, the sensing element comprised in each pixel element in the plurality of pixel elements may comprise a photo-sensitive element configured to provide a photocurrent indicative of an amount of light incident on the sensing element of the pixel element; and a capacitor coupled to the photo-sensitive element to integrate the photocurrent. The calibration circuitry may comprise a photo-sensitive element configured to provide a photocurrent indicative of an amount of light incident on the sensing element of the calibration circuitry; and a capacitor coupled to the photo-sensitive element, wherein the capacitor of the calibration circuitry may be additionally coupled to the input of the calibration circuitry, to integrate a sum of the photocurrent and a calibration input current indicative of the calibration input signal.

It should be noted that the photo-sensitive element may, for example, be a photo-diode or a transistor including a photo-diode, and that the capacitor in each pixel element and the capacitor in the calibration circuitry, respectively, may be provided in the form of a parasitic capacitance of the photo-diode or transistor. Alternatively, the capacitor may be provided as a metal-insulator-metal capacitor or any other suitable capacitor.

To make the calibration independent of present illumination conditions, the calibration input current may be greater than a maximum photocurrent that can be provided by the photo-sensitive element in the sensing element of the calibration circuitry. For example, the calibration input current may be at least five times greater than the maximum photocurrent that can be provided by the photo-sensitive element in the sensing element of the calibration circuitry.

In embodiments, the sensing signal providing element comprised in each pixel element in the plurality of pixel elements may be configured to provide the sensing signal in the form of a sensing current indicative of the photocurrent integrated by the capacitor in the sensing element; and the calibration circuitry may be configured to provide a calibration output signal indicative of the sum of the photocurrent and the calibration input current integrated by the capacitor in the calibration circuitry.

Furthermore, the read-out circuitry may comprise read-out conversion circuitry configured to convert the sensing current to a sensing voltage; and the calibration circuitry may comprise calibration conversion circuitry configured to convert the calibration output current to a calibration output voltage.

The fingerprint sensing system according to embodiments of the present invention may be included in an electronic device further comprising processing circuitry coupled to the fingerprint sensing system, and configured to perform an authentication based on the sensing signals acquired by the read-out circuitry of the fingerprint sensing system.

In summary, the present invention thus relates to a fingerprint sensing system comprising a plurality of conductive selection lines; a plurality of conductive read-out lines crossing the selection lines; selection circuitry controllable to provide a selection signal on at least one selected selection line in the plurality of selection lines; a plurality of pixel elements formed at intersections between the selection lines and the read-out lines; read-out circuitry coupled to each read-out line in the plurality of read-out lines, the read-out circuitry being configured to acquire a read-out signal via a read-out line connected to a selected pixel element, and calibration circuitry having an input for receiving a calibration input signal and an output for providing a calibration output signal, the calibration output signal being formed through interaction between the calibration input signal and the calibration circuitry.

BRIEF DESCRIPTION OF THE DRAWINGS

These and other aspects of the present invention will now be described in more detail, with reference to the appended drawings showing example embodiments of the invention, wherein.

DETAILED DESCRIPTION OF EXAMPLE EMBODIMENTS

In the present detailed description, various embodiments of the fingerprint sensing system according to the present invention are mainly described with reference to a fingerprint sensing system in which the sensing elements are light-sensitive pixel elements, capable of sensing differences in the amount of light hitting the different pixel elements. Furthermore, the fingerprint sensing system is mainly described as being arranged under a display panel. However, this should not be construed as limiting the present invention, as defined by the claims. According to embodiments, other types of pixel elements may be used, that may be responsive to other properties than light. Furthermore, the fingerprint sensing system need not be arranged under a display panel, but may be used in other configurations, such as under a cover glass plate or over a display panel etc.

Figure 1:
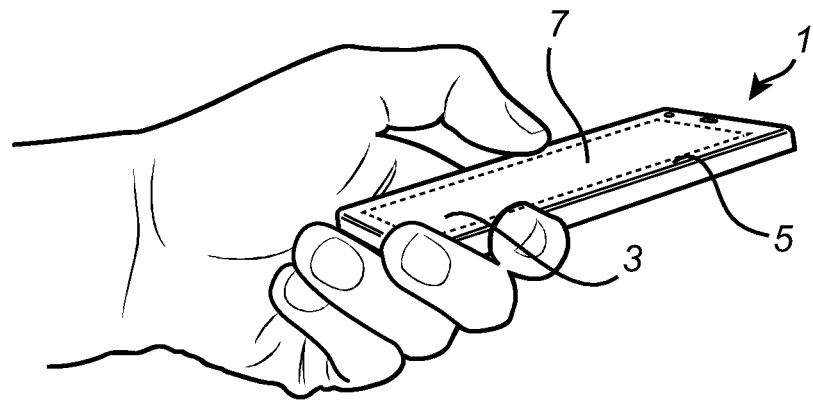
FIG. 1 is an illustration of an exemplary electronic device comprising a fingerprint sensing system according to an embodiment of the present invention, in the form of a mobile phone.

Turning now to the drawings and in particular to FIG. 1, there is schematically illustrated an example of an electronic device 1 configured to apply the concept according to the present disclosure, in the form of a mobile device with an integrated in-display fingerprint sensing system 3 and a display panel 5 with a touch screen interface 7. The fingerprint sensing system 3 may, for example, be used for unlocking the mobile device 1 and/or for authorizing transactions carried out using the mobile device 1, etc.

The fingerprint sensing system 3 is here shown to be smaller than the display panel 5, but still relatively large, e.g. a large area implementation. In another advantageous implementation the fingerprint sensing system 3 may be the same size as the display panel 5, i.e. a full display solution. Thus, in such case the user may place his/her finger anywhere on the display panel for biometric authentication. The fingerprint sensing system 3 may in other possible implementations be smaller than the depicted fingerprint sensing system, such as providing a hot-zone implementation.

Preferably and as is apparent to the skilled person, the mobile device 1 shown in FIG. 1 may further comprise a first antenna for WLAN/Wi-Fi communication, a second antenna for telecommunication communication, a microphone, a speaker, and a phone control unit. Further hardware elements are of course possibly comprised with the mobile device.

It should furthermore be noted that the invention may be applicable in relation to other types of electronic devices, such as smart watches, laptops, tablet computers, etc.

Figure 2:
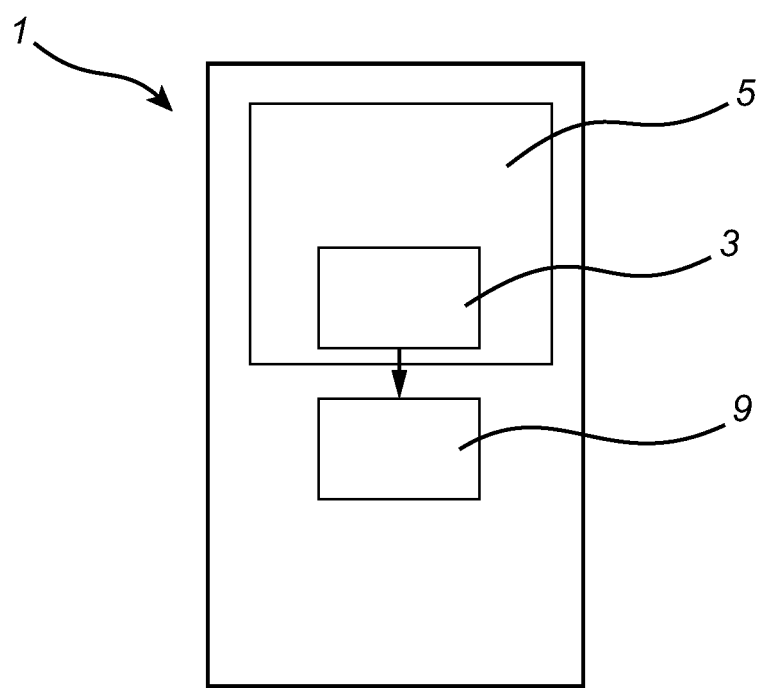
FIG. 2 is a schematic block diagram of the electronic device in FIG. 1.

FIG. 2 is a schematic block diagram of the electronic device 1 in FIG. 1. The electronic device 1 comprises a transparent display panel 5 and a fingerprint sensing system 3 conceptually illustrated to be arranged under the transparent display panel 5. Furthermore, the electronic device 1 comprises processing circuitry such as control unit 9 coupled to the fingerprint sensing system 3, and configured to perform an authentication based on signals provided by the fingerprint sensing system 3. The control unit 9 may be stand-alone control unit of the electronic device 9, e.g. a device controller. Alternatively, the control unit 9 may be comprised in the fingerprint sensing system 3.

Figure 3:
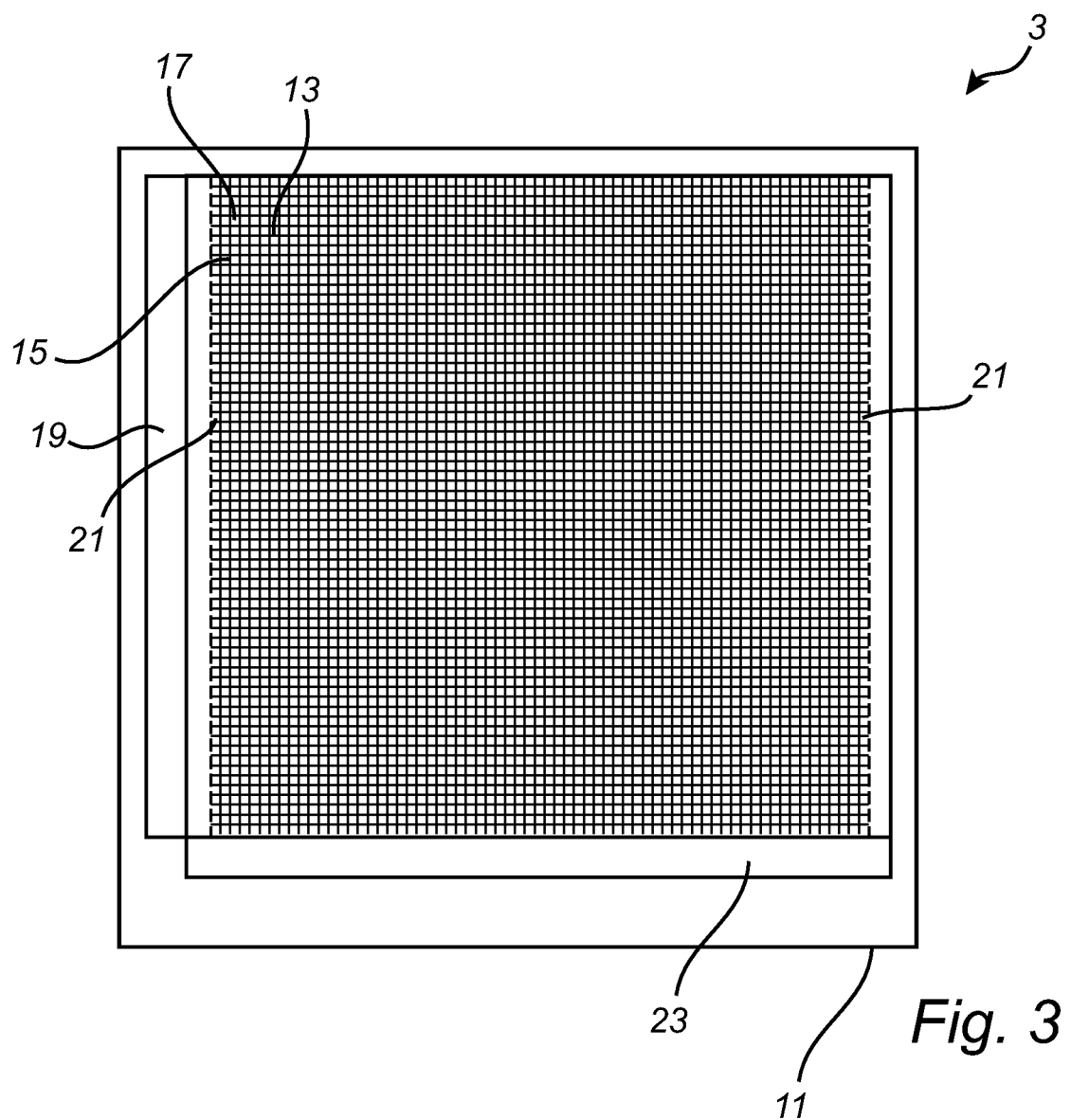
FIG. 3 schematically illustrates a fingerprint sensing system according to a first example embodiment of the present invention.

A fingerprint sensing system 3 according to a first example embodiment of the present invention will now be described with reference to FIG. 3. As is schematically indicated in FIG. 3, the fingerprint sensing system 3 comprises structures formed on a substrate or carrier 11. In particular in embodiments where the fingerprint sensing system 3 is primarily manufactured using TFT-techniques, which are per se known to those skilled in the art, the carrier 11 may advantageously be made of glass or plastic. On the substrate 11 are formed a plurality of conductive selection lines 13 and a plurality of conductive read-out lines 15. The selection lines 13 are arranged in parallel to each other, and the read-out lines 15 are arranged in parallel to each other and crossing the selection lines 13. The selection lines 13 are conductively separated from the read-out lines 15, typically by a dielectric layer deposited between a first conductive layer including the selection lines 13 and a second conductive layer including the read-out lines 15. A plurality of pixel elements 17, here forming a pixel element array, are formed at respective intersections between the selection lines 13 and the read-out lines 15. In addition to the selection lines 13 and the read-out lines 15, the fingerprint sensing system 3 according to the first example embodiment in FIG. 3 comprises selection circuitry 19 coupled to each of the selection lines 13, calibration circuitry 21, and read-out circuitry 23 coupled to each read-out line 15. In the exemplary illustration in FIG. 3, the calibration circuitry is shown in the form of two calibration elements 21 at opposite edges of the pixel element array. This should not be construed as limiting the configuration or arrangement of the calibration circuitry. In embodiments, the calibration circuitry may, for example, include only one calibration element 21 or the calibration circuitry may be distributed in another manner. For instance, one or several calibration elements 21 may be centrally located in the sensing element array. Through the provision of the calibration circuitry 21, individual fingerprint sensing systems 3 can be characterized and/or calibrated, in connection with production as well as when in use by an end-user.

Various functional elements of the fingerprint sensing system in FIG. 3 will now be described with reference to FIGS. 4A-B.

Figure 4A:
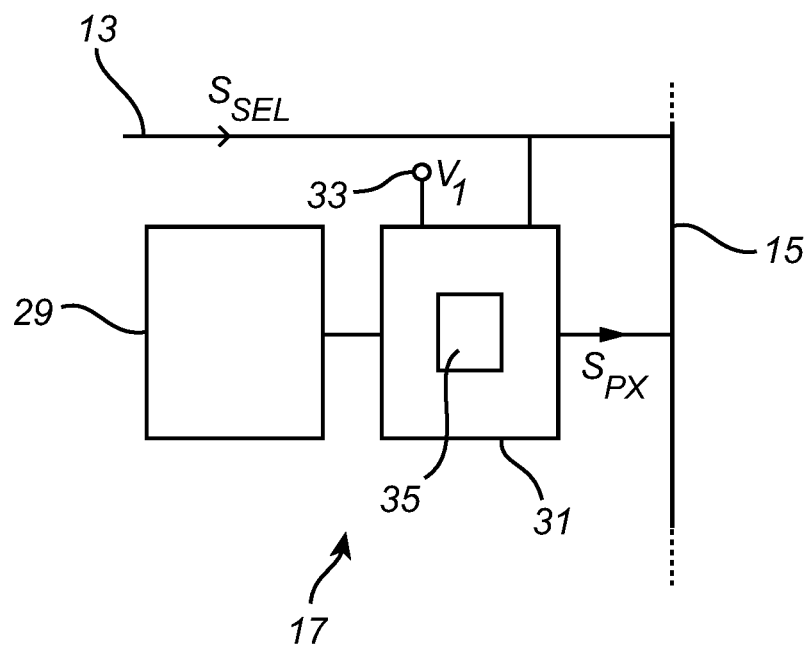
FIG. 4A is a schematic illustration of a pixel element comprised in the fingerprint sensing system in FIG. 3.

FIG. 4A is a schematic illustration of a pixel element 17 comprised in the fingerprint sensing system 3 in FIG. 3. Referring to FIG. 4A, the pixel element 17 comprises a sensing element 29 and a sensing signal providing element 31. As was discussed in the Summary section further above, the sensing element 29 is responsive to a property indicative of a distance between the sensing element 29 and the finger surface, to provide an output indicating a sensed value of the property. In the exemplary configuration in FIG. 4A, the output may suitably be a current or a voltage, that indicates the sensed value of the property. As is schematically indicated in FIG. 4A, the sensing signal providing element 31 may be coupled to a first driving voltage source 33, the sensing element 29, the selection line 13 and the read-out line 15. In response to a selection signal $S_{SEL}$ provided by the selection circuitry 19 on the selection line 13 to which the sensing signal providing element 31 is connected, the sensing signal providing element 31 is configure to provide, to the read-out line 15, a pixel signal $S_{PX}$ being dependent on the above-mentioned output provided by the sensing element 29. The first driving voltage source 33 may, for example, be at a first reference potential $V_1$ of the fingerprint sensing system 3, and may be capable of providing power to the pixel elements 17 of the fingerprint sensing system 3. For example the first reference potential may be +5V, but other potentials are also possible. As is schematically indicated in FIG. 4A, the pixel element 17 comprises semiconductor circuitry 35. It should be understood that the semiconductor circuitry 35 may be any semiconductor circuitry that is useful for the functionality of the pixel element 17. Accordingly, the semiconductor circuitry 35 may include one or several of a transistor or transistors, and a photo-diode or photo-diodes, etc. In FIG. 4A, the semiconductor circuitry 35 is schematically indicated as being included in the sensing signal providing element 31. It should, however, be understood that this is only an exemplary illustration, and that the sensing element 29 may include semiconductor circuitry 35, and that the sensing signal providing element 31 may lack semiconductor circuitry. It should also be noted that, depending on the configuration of the fingerprint sensing system 3, the sensing element 29 and the sensing signal providing element 31 may be combined in a single element providing the combined functionalities of the sensing element 29 and the sensing signal providing element 31.

Figure 4B:
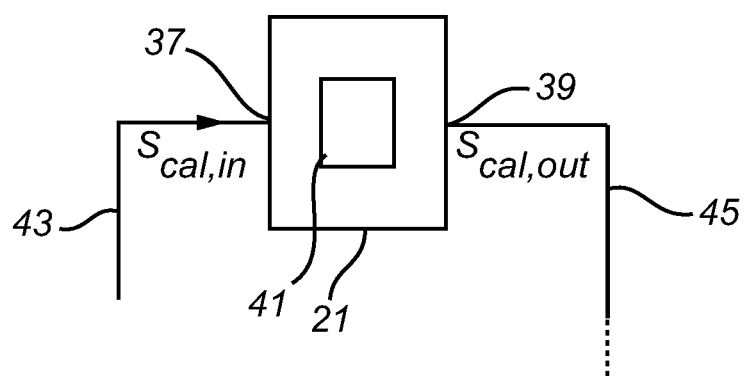
FIG. 4B is a schematic illustration of calibration circuitry comprised in the fingerprint sensing system in FIG. 3.

FIG. 4B is a schematic illustration of calibration circuitry, here in the form of a calibration element 21, that may be comprised in the fingerprint sensing system 3 in FIG. 3. As is schematically shown in FIG. 4B, the calibration circuitry 21 has an input 37 for receiving a calibration input signal $S_{cal,in}$, and an output 39 for providing a calibration output signal $S_{cal,out}$. The calibration output signal $S_{cal,out}$ is formed through interaction between the calibration input signal $S_{cal,in}$ and the calibration circuitry 21, and the calibration circuitry 21 comprises semiconductor circuitry 41.

To provide for reliable calibration of the fingerprint sensing system 3, the semiconductor circuitry 41 comprised in the calibration circuitry 21 has been formed using the same materials and the same processing steps as used for the semiconductor circuitry 35 comprised in the pixel elements 17. Advantageously, the semiconductor circuitry 35 in the pixel elements 17 and the semiconductor circuitry 41 in the calibration circuitry 21 may be manufactured simultaneously. Furthermore, the semiconductor circuitry 35 in each pixel element 17 and the semiconductor circuitry 41 in the calibration circuitry 21 may comprise at least one semiconductor component, such as transistor or diode, with identical or at least similar specifications. As is schematically indicated in FIG. 4B, the fingerprint sensing system 3 may comprise a dedicated calibration input line 43 connected to the input 37 of the calibration circuitry 21, and a dedicated calibration output line 45 connected to the output 39 of the calibration circuitry 21. In embodiments where the calibration circuitry 21 comprises a plurality of calibration elements, the calibration elements may have a common calibration input line and individual calibration output lines, or the calibration elements may have individual calibration input lines and individual calibration output lines. It may also be feasible in some embodiments to have a plurality of calibration elements with a common calibration output line.

A fingerprint sensing system 3 according to a second example embodiment of the present invention will now be described with reference to FIG. 5.

Figure 5:
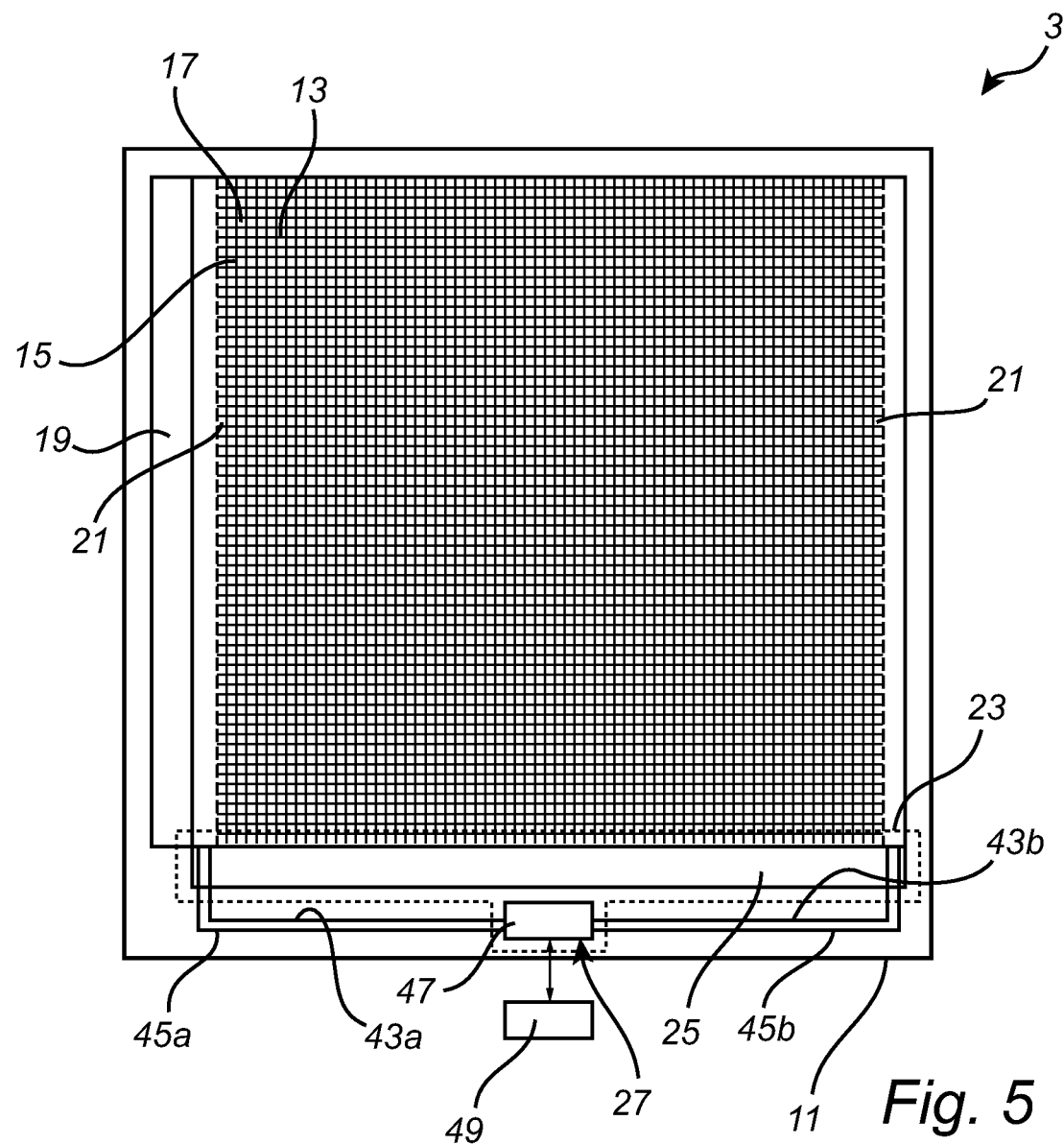
FIG. 5 schematically illustrates a fingerprint sensing system according to a second example embodiment of the present invention.

In the example configuration of FIG. 5, the functionality of the read-out circuitry 23 is partly provided by a portion 25 of the TFT-module, and partly by an ASIC 27 coupled to the TFT-module.

In this second example embodiment, the fingerprint sensing system 3 further comprises calibration signal providing circuitry 47 and operation control circuitry 49. The calibration signal providing circuitry 47 is here illustrated as being comprised in the ASIC 27, and the operation control circuitry 49 is illustrated as being provided outside the substrate 11 on which the TFT-structures are formed. It should be noted that many other configurations may be feasible. For instance, the operation control circuitry 49 may also be comprised in the ASIC 27. Alternatively, both the calibration signal providing circuitry 47 and the operation control circuitry 49 may be provided by circuitry arranged outside the substrate 11. For example such circuitry may be comprised in host circuitry and/or at least partly realized by software.

As is schematically illustrated in FIG. 5, the calibration signal providing circuitry 47 is coupled to the calibration circuitry 21 by calibration input lines 43a-b and calibration output lines 45a-b. The calibration signal providing circuitry 47 provides the above-mentioned calibration input signal(s) $S_{cal,in}$ to the calibration circuitry 21 through the calibration input lines 43a-b, and receives the above-mentioned calibration output signal(s) $S_{cal,out}$ from the calibration circuitry 21 through the calibration output lines 45a-b.

As is schematically shown in FIG. 5, the operation control circuitry 49 is coupled to the calibration signal providing circuitry 47 for receiving information indicative of at least the calibration output signal(s) $S_{cal,out}$ from the calibration signal providing circuitry 47. Based on an analysis of the calibration output signal(s) $S_{cal,out}$, the operation control circuitry 49 may control the operation of the fingerprint sensing system 3. Such control of the operation may, for example, be carried out by providing control signals to the ASIC 27, as is schematically indicated in FIG. 5. It should, however, be understood that the operation control may be realized in many other ways, as will be readily realized by one skilled in the art of control of sensing systems, such as TFT-based sensing systems.

Figure 6:
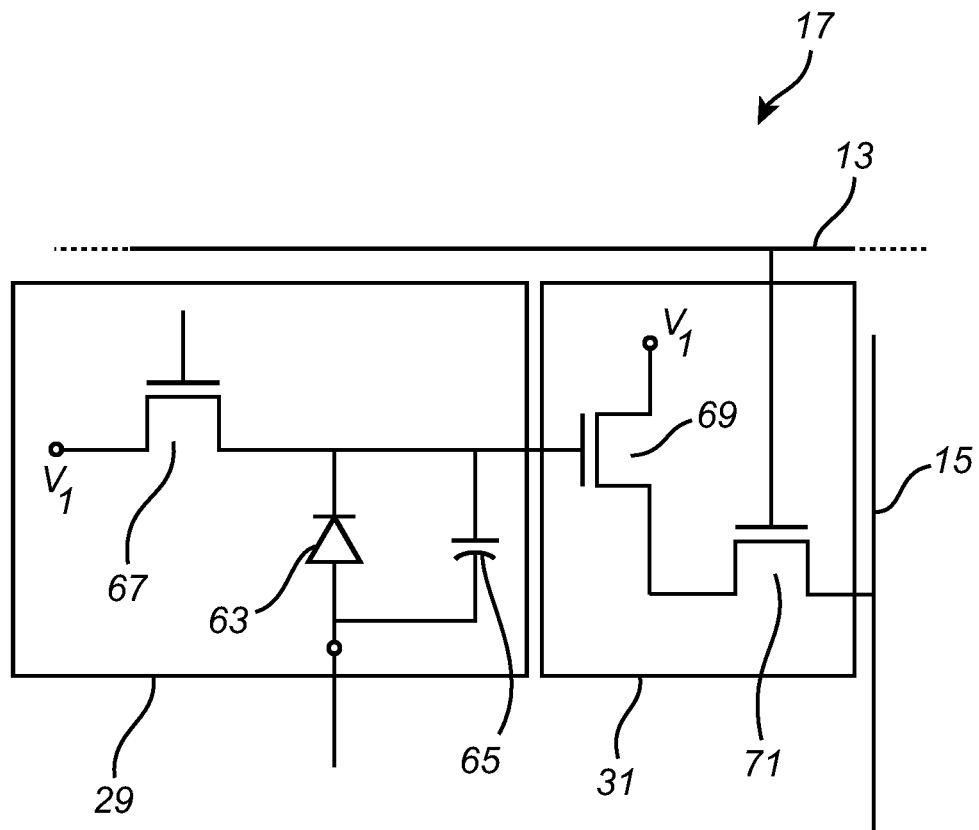
FIG. 6 schematically shows an example of a pixel element comprised in the fingerprint sensing system according to embodiments of the present invention, in the form of an optical pixel element.

FIG. 6 schematically shows a concrete example of a pixel element 17 that may be comprised in the fingerprint sensing system 3 according to embodiments of the present invention, in the form of an optical pixel element.

In the exemplary optical pixel element 17 in FIG. 6, the sensing element 29 comprises semiconductor circuitry including a photo-diode 63, a pixel integrator 65, and a reset switch 67. The sensing signal providing circuitry 31 comprises semiconductor circuitry including a controllable current source 69 and a selection switch 71.

In operation, light incident on the photo-diode 63 results in a photo-current, which is provided to the pixel integrator 65 during an integration time to convert the accumulated photo-current to a voltage indicative of the amount of light incident on the photo-diode 63 during the integration time. This accumulated photo-current (and thus the voltage on the pixel integrator 65) is, at least to some degree, indicative of the distance between the photo-diode 63 and the finger surface.

The voltage output of the sensing element 29 controls the controllable current source 69 in the sensing signal providing element 31 to generate a sensing current, which is provided to the read-out line 15 if the selection switch 71 is operated by a selection signal on the selection line 13. After a read-out event, the pixel element 17 is reset by providing a reset signal to the reset switch 67.

It should be noted that the pixel integrator 65 may be realized by a parasitic capacitance in the semiconductor structure used for forming the photo-diode 63.

Figure 7:
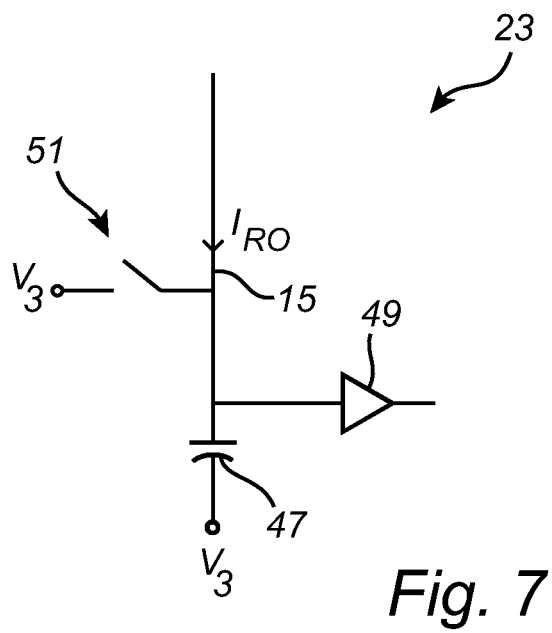
FIG. 7 schematically shows an example configuration of read-out circuitry comprised in the fingerprint sensing system according to embodiments of the present invention.

FIG. 7 is an example conceptual configuration of a portion of the read-out circuitry 23 that may suitably be comprised in the embodiments of the fingerprint sensing system 3 described so far with reference to FIG. 3 and FIG. 5. Specifically, a portion of the read-out circuitry 23 connected to one read-out line 15 is shown. As is schematically indicated in FIG. 7, the read-out circuitry 23 comprises an integrator 47, here shown as a capacitor, an amplifier 49, and a reset switch 51.

The integrator 47 is connected between a reference potential $V_3$, which may for example be a ground potential or a predefined negative potential, such as −5V, and the read-out line 15 to convert the current provided to the integrator 47 during an integration time to a voltage. The voltage is amplified by the amplifier 49 and output. Following one read-out sequence, the integrator 47 is reset by operation of the read-out switch 51.

In example configurations, the calibration circuitry 21 may include circuitry that is substantially identical with the circuitry comprised in the pixel elements 17.

Figure 8A:
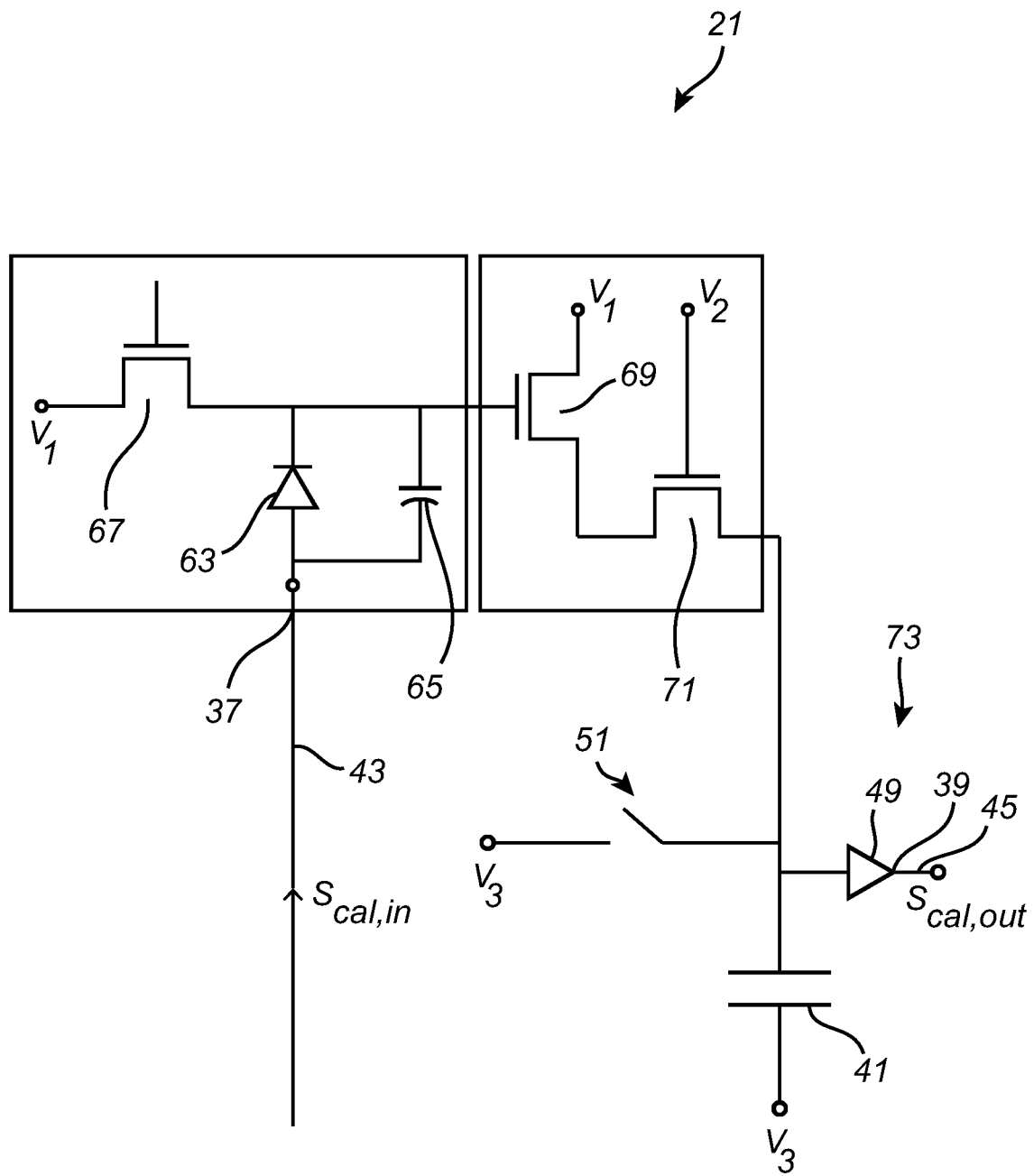
FIG. 8A schematically shows a first example of calibration circuitry comprised in the fingerprint sensing system according to embodiments of the present invention, having the optical pixel element in FIG. 6 and the read-out circuitry in FIG. 7.

FIG. 8A schematically shows a first example of calibration circuitry 21 comprised in the fingerprint sensing system according to embodiments of the present invention, having the optical pixel element 17 in FIG. 6. Referring to FIG. 8A, the input 37 of the calibration circuitry 21 is connected to the pixel integrator 65, so that a calibration input signal $S_{cal,in}$ in the form of a calibration input current results in a voltage output of the sensing element portion 29 of the calibration element 21. This voltage output controls the controllable current source 69 as described above in connection with FIG. 6. In the calibration element 21, the selection switch 71 is controlled to always be on through the provision of a suitable bias voltage V2, and a current is therefore provided to a read-out portion 73 of the calibration circuitry 21 that may be substantially identical to read-out circuitry that may be used to read out sensing current from the pixel elements 17 connected to a read-out line 15, as was described above with reference to FIG. 7. Accordingly, the read-out portion 73 of the calibration circuitry 71 may comprise an integrator 47, here shown as a capacitor, an amplifier 49, and a reset switch 51, advantageously manufactured with the same specifications and the corresponding components comprised in the read-out circuitry 23 of the fingerprint sensing system 3.

In the first example configuration of the calibration circuitry 21 shown in FIG. 8A, the properties of substantially all of the pixel elements in the fingerprint sensing system 3 can be evaluated indirectly by providing a calibration input signal in the form of a known calibration input current. The integrator 65 in the calibration circuitry 21 will then integrate the sum of the photocurrent from the photodiode 63 and the calibration input current. For improved calibration, it may be desirable to control the calibration input current to be much bigger than the maximum photocurrent, so that the photocurrent can be disregarded for calibration purposes. Referring to the fingerprint sensing system 3 in FIG. 5, this may, for example, be realized by the operation control circuitry 49 controlling the calibration signal providing circuitry 47 to output a desired calibration input current.

Based on the calibration output signal $S_{cal,out}$, here a calibration output voltage on the calibration output line 45 connected to the calibration output 39 of the amplifier 49, conclusions can be drawn about the properties of the fingerprint sensing system 3 in general, and the pixel elements 17 and read-out circuitry 23 in particular.

Figure 8B:
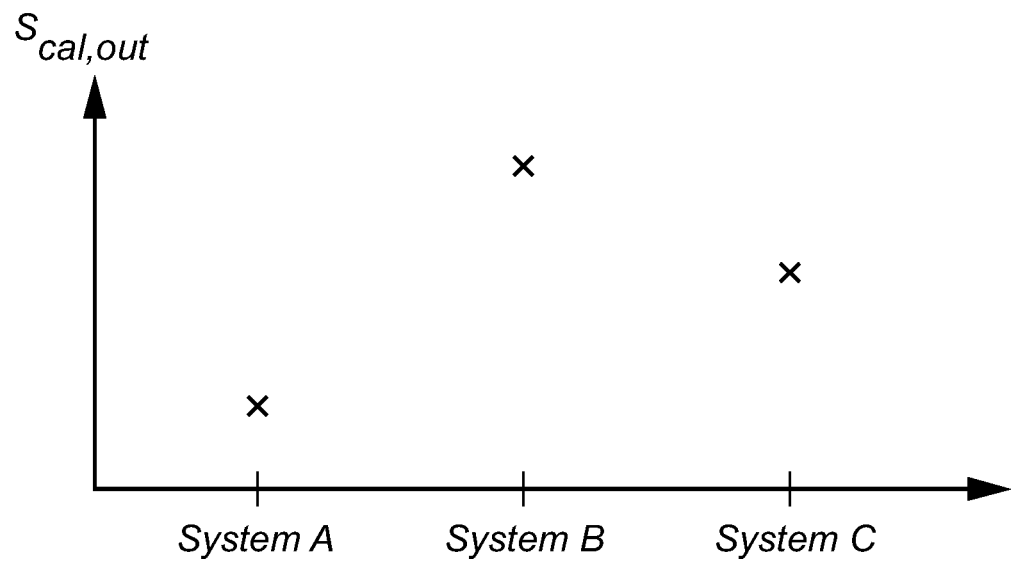
FIGS. 8B-C schematically illustrate exemplary calibration output signals from the calibration circuitry in FIG. 8A.

For example, different fingerprint sensing systems 3 manufactured at different times may exhibit different behaviors due to differences in the manufacturing conditions. This is schematically illustrated in FIG. 8B, where the calibration output signals $S_{cal,out}$ for three different exemplary fingerprint sensing systems, labeled "System A", "System B", and "System C" are plotted. Based on such or similar readings, sensing settings such as bias levels and integration times etc can be adapted to bring the behaviors of the different systems closer to each other. In particular, the settings may be tuned to achieve an improved dynamic range for at least some of the fingerprint sensing systems 3. This provides for improved quality of the signals provided by the fingerprint sensing systems 3.

Figure 8C:
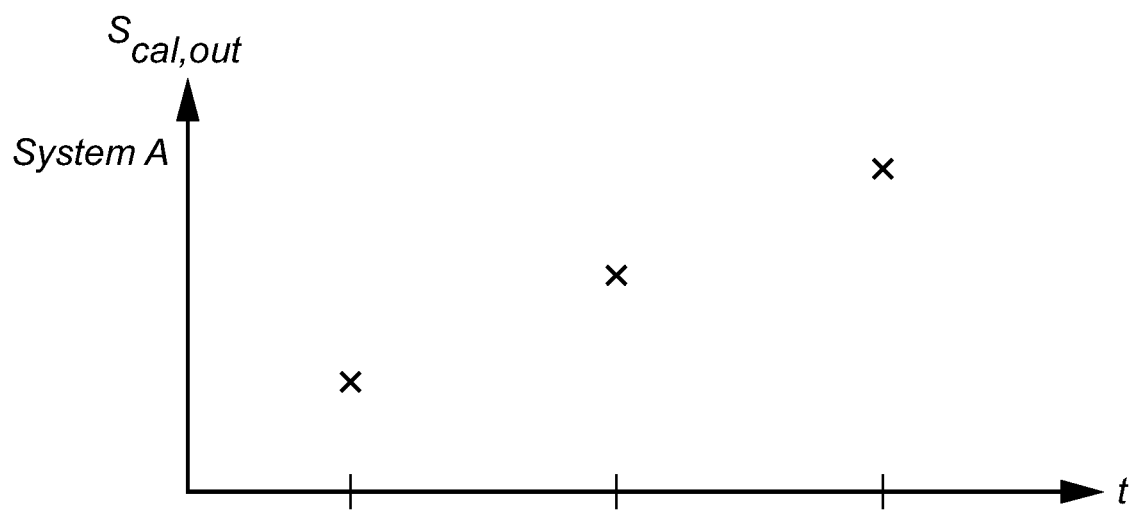

According to another example, calibration operations may be carried out at different times when the fingerprint sensing system 3 is integrated in a product, such as the mobile phone 1 in FIG. 1. This is schematically illustrated in FIG. 8C. Based on such or similar readings of the calibration output signal $S_{cal,out}$, sensing settings such as bias levels and integration times etc can be adapted to make the behavior of the fingerprint sensing system 3 more uniform over time, to counteract variations that may otherwise occur, for example due to different ambient temperatures etc. In particular, the settings may be tuned to achieve an improved dynamic range over time. This provides for improved quality of the signals provided by the fingerprint sensing system 3.

Figure 9A:
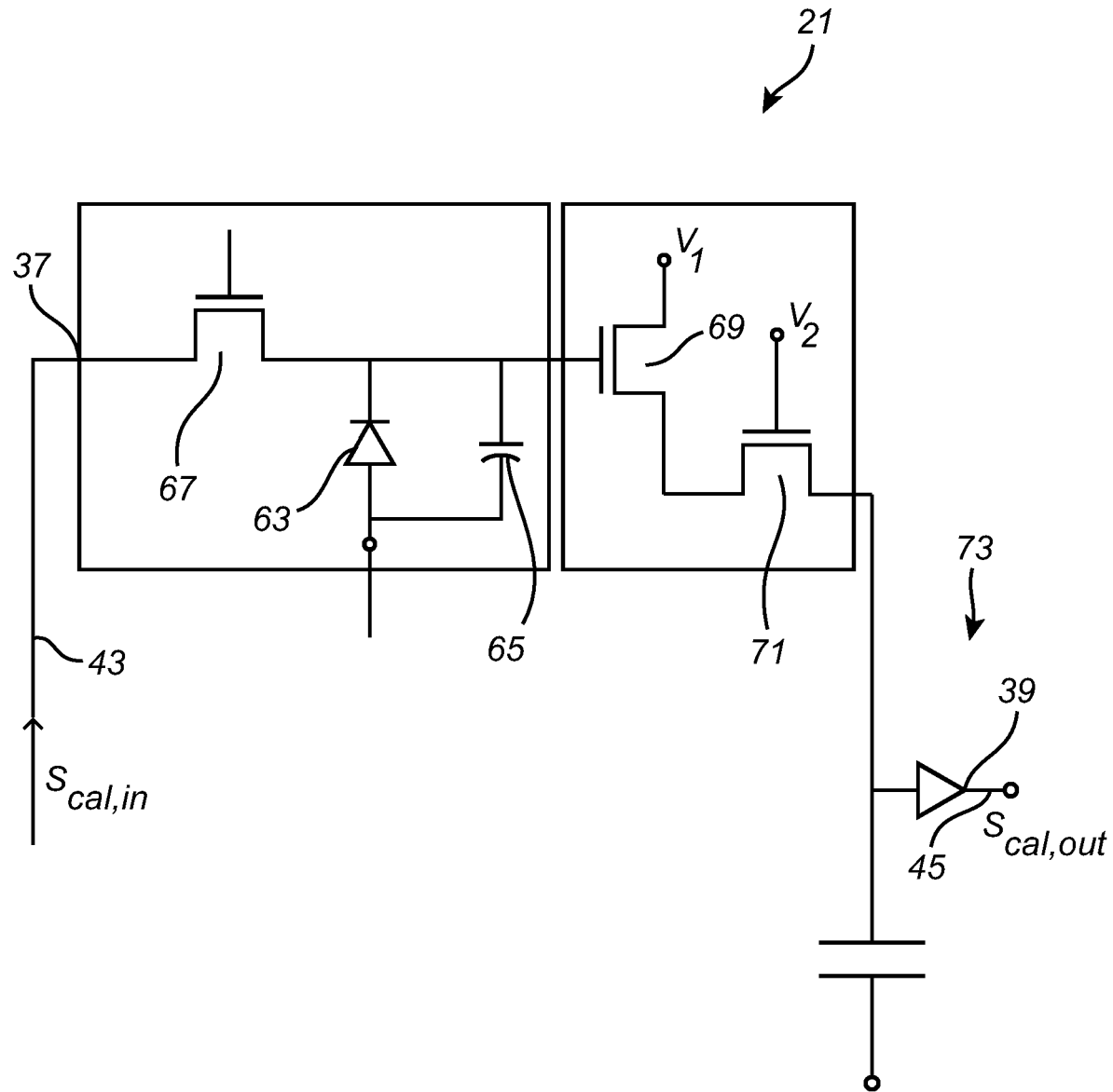
FIG. 9A schematically shows a second example of calibration circuitry comprised in the fingerprint sensing system according to embodiments of the present invention, having the optical pixel element in FIG. 6 and the read-out circuitry in FIG. 7.

FIG. 9A schematically shows a second example configuration of calibration circuitry 21 comprised in the fingerprint sensing system 3 according to embodiments of the invention. The second example configuration in FIG. 9A mainly differs from the first example configuration in FIG. 8A in that the calibration input 37 is connected to the gate of the controllable current source 69 via the reset switch 67. In this example configuration of the calibration circuitry 21, the calibration input signal $S_{cal,in}$ may advantageously be a calibration input voltage.

Figure 9B:
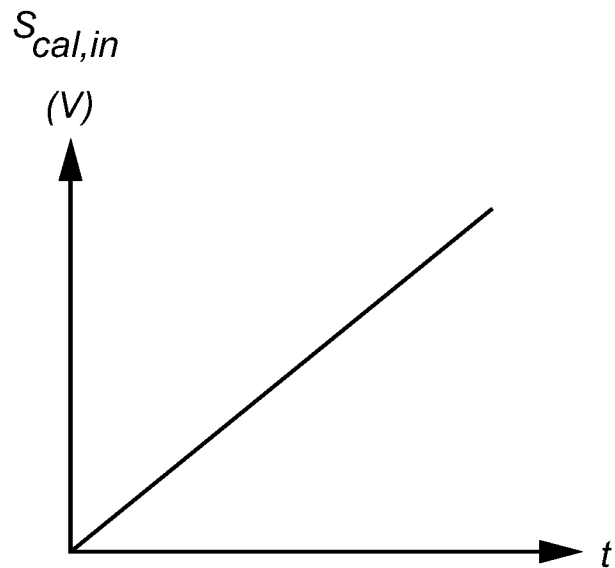
FIG. 9B schematically illustrates and exemplary calibration input signal provided to the calibration circuitry in FIG. 9A.
Figure 9C:
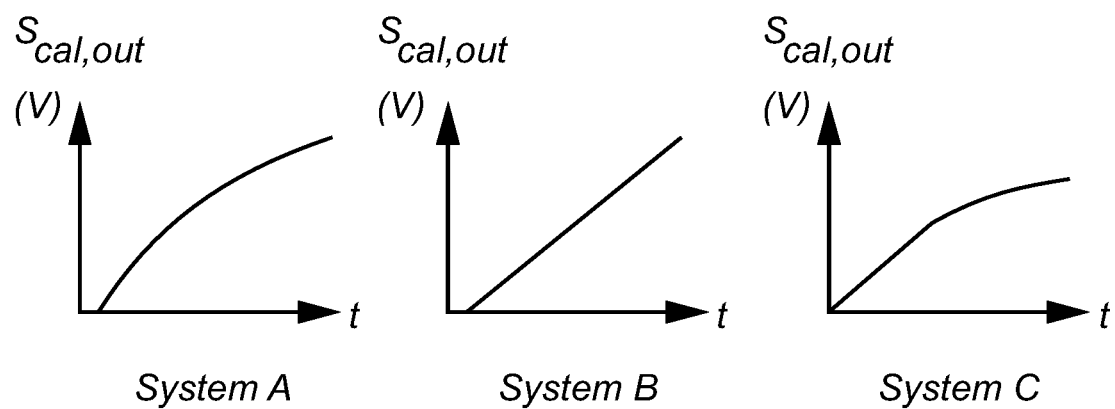
FIG. 9C schematically illustrates exemplary calibration output signals from the calibration circuitry in FIG. 9A, in response to the calibration input signal in FIG. 9B.

As is schematically shown in FIG. 9B, the calibration input voltage may, for example, be provided in the form of a voltage ramp. The calibration output signal $S_{cal,out}$ can then be evaluated, for example, through a comparison between the output ramp and the input ramp for different systems.

The first and second example configurations of the calibration circuitry described above are merely intended as illustrative examples. Many other calibration circuitry configurations are possible and may be suitable depending on, for example, the configuration of the pixel elements 17 of the fingerprint sensing system 3. Furthermore, more than one calibration input signal $S_{cal,in}$ and/or more than one calibration output signal $S_{cal,out}$ may be evaluated as part of a calibration process. As one example, the calibration circuitry 21 may be provided as a combination of the two exemplary configurations in FIG. 8A and FIG. 9A, with two inputs for different calibration input signals. In addition, the calibration input signal $S_{cal,in}$ need not be provided in the form of a calibration input current as in FIG. 8A or a calibration input voltage as in FIG. 9A. In these example configurations, the calibration input signal may instead be provided in the form of an optical signal.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A fingerprint sensing system for sensing a finger surface of a finger, comprising: a plurality of conductive selection lines arranged in parallel to each other; a plurality of conductive read-out lines arranged in parallel to each other and crossing the selection lines; selection circuitry coupled to each selection line in the plurality of selection lines, and controllable to provide a selection signal on at least one selected selection line in the plurality of selection lines; a plurality of pixel elements, each being formed at a respective intersection between a selection line in the plurality of selection lines and a read-out line in the plurality of read-out lines, each pixel element in the plurality of pixel elements comprising: a sensing element responsive to a property indicative of a distance between the sensing element and the finger surface to provide an output indicating a sensed value of the property; and a sensing signal providing element coupled to the sensing element, the selection line and the read-out line, the sensing signal providing element being configured to provide to the read-out line, in response to the selection signal being provided on the selection line, a sensing signal being dependent on the output provided by the sensing element; read-out circuitry coupled to each read-out line in the plurality of read-out lines for acquiring the sensing signal via a read-out line connected to a selected pixel element; and calibration circuitry having an input for receiving a calibration input signal and an output for providing a calibration output signal, the calibration output signal being formed through interaction between the calibration input signal and the calibration circuitry, wherein: each pixel element in the plurality of pixel elements comprises semiconductor circuitry, and the calibration circuitry comprises semiconductor circuitry; and the semiconductor circuitry comprised in each pixel element and the semiconductor circuitry comprised in the calibration circuitry have been formed using the same materials and the same processing steps, wherein the calibration circuitry comprises a sensing element responsive to a property indicative of a distance between the sensing element and the finger surface to provide an output indicating a sensed value of the property, wherein: the sensing element comprised in each pixel element in the plurality of pixel elements comprises: a photo-sensitive element configured to provide a photocurrent indicative of an amount of light incident on the sensing element of the pixel element; and a capacitor coupled to the photo-sensitive element to integrate the photocurrent; and the calibration circuitry comprises: a second photo-sensitive element configured to provide a photocurrent indicative of an amount of light incident on the sensing element of the calibration circuitry; and a second capacitor coupled to the photo-sensitive element, wherein the second capacitor of the calibration circuitry is additionally coupled to the input of the calibration circuitry, to integrate a sum of the photocurrent and a calibration input current indicative of the calibration input signal.

2. The fingerprint sensing system according to claim 1, wherein the fingerprint sensing system comprises, in addition to the plurality of selection lines and the plurality of read-out lines:
   a calibration input line connected to the input of the calibration circuitry; and
   a calibration output line connected to the output of the calibration circuitry.

3. The fingerprint sensing system according to claim 1, wherein the fingerprint sensing system further comprises:
   calibration signal providing circuitry coupled to the calibration circuitry for providing the calibration input signal to the calibration circuitry and receiving the calibration output signal provided by the calibration circuitry.

4. The fingerprint sensing system according to claim 3, wherein the fingerprint sensing system further comprises operation control circuitry coupled to the calibration signal providing circuitry for controlling operation of the fingerprint sensing system based on a relation between the calibration output signal and the calibration input signal.

5. The fingerprint sensing system according to claim 3, wherein the fingerprint sensing system comprises:
a TFT module including at least the selection lines, the read-out lines, the pixel elements, and the calibration circuitry.

6. The fingerprint sensing system according to claim 5, wherein the fingerprint sensing system comprises:
an ASIC coupled to the TFT-module, the ASIC including the calibration signal providing circuitry.

7. The fingerprint sensing system according to claim 1, wherein the input for receiving the calibration input signal is constituted by the sensing element comprised in the calibration circuitry.

8. The fingerprint sensing system according to claim 1, wherein the calibration input current is greater than a maximum photocurrent that can be provided by the photosensitive element in the sensing element of the calibration circuitry.

9. The fingerprint sensing system according to claim 1 wherein: the sensing signal providing element comprised in each pixel element in the plurality of pixel elements is configured to provide the sensing signal in the form of a sensing current indicative of the photocurrent integrated by the capacitor in the sensing element; and the calibration circuitry is configured to provide a calibration output signal indicative of the sum of the photocurrent and the calibration input current integrated by the second capacitor in the calibration circuitry.

10. The fingerprint sensing system according to claim 9, wherein:
the read-out circuitry comprises read-out conversion circuitry configured to convert the sensing current to a sensing voltage; and
the calibration circuitry comprises calibration conversion circuitry configured to convert the calibration output current to a calibration output voltage.

11. An electronic device, comprising:
the fingerprint sensing system according to claim 1; and processing circuitry coupled to the fingerprint sensing system, and configured to perform an authentication based on the sensing signals acquired by the read-out circuitry of the fingerprint sensing system.

* * * * *